United States Patent [19]
Traylor

[11] Patent Number: 5,801,654
[45] Date of Patent: Sep. 1, 1998

[54] APPARATUS AND METHOD FOR FREQUENCY TRANSLATION IN A COMMUNICATION DEVICE

[75] Inventor: Kevin Bruce Traylor, North Richland Hills, Tex.

[73] Assignee: Motorola, Inc., Schaumburg, Ill.

[21] Appl. No.: 407,546

[22] Filed: Mar. 20, 1995

Related U.S. Application Data

[63] Continuation-in-part of Ser. No. 80,247, Jun. 21, 1993, abandoned.

[51] Int. Cl.[6] ............................................. H03M 1/64
[52] U.S. Cl. ........................................ 341/144; 375/279
[58] Field of Search .................................... 341/144, 157; 375/261, 279

[56] References Cited

U.S. PATENT DOCUMENTS

| | | |
|---|---|---|
| 4,142,241 | 2/1979 | Freilich et al. ............... 364/724 |
| 4,727,752 | 3/1988 | Peters ............................ 73/517 AV |
| 5,150,121 | 9/1992 | Newell et al. ................. 341/157 |
| 5,668,842 | 9/1997 | Sorace et al. ................. 375/308 |

Primary Examiner—Howard L. Williams
Assistant Examiner—Peguy JeanPierre
Attorney, Agent, or Firm—Richard A. Sonnentag

[57] ABSTRACT

A frequency translation device in a first embodiment includes a plurality of multiplying digital-to-analog converters (MDACs) that multiply an input signal by phase shifted digital sinewave approximation signals to perform frequency translation. In the preferred embodiment the input includes inphase and quadrature phase components, one of which is multiplied by a digital sinewave approximation and the other is multiplied by a digital cosinewave approximation. The use of the multiple MDACs with differing sinewave approximation signals provides a signal that multiplies the input signal such that the effects of odd harmonics at an output are mitigated while the advantages of a traditional switching mixer are retained.

14 Claims, 3 Drawing Sheets

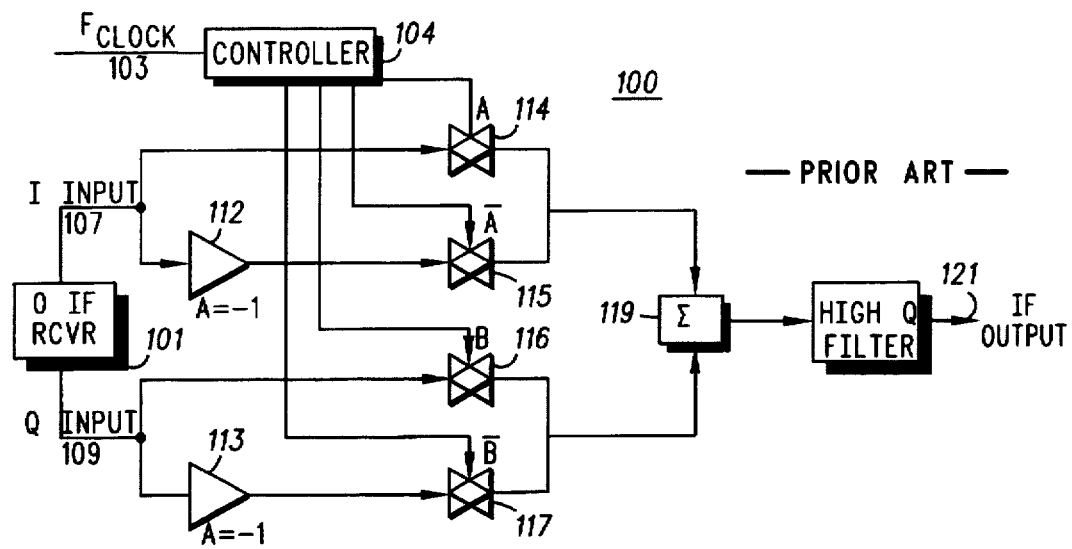
FIG.1 — PRIOR ART —
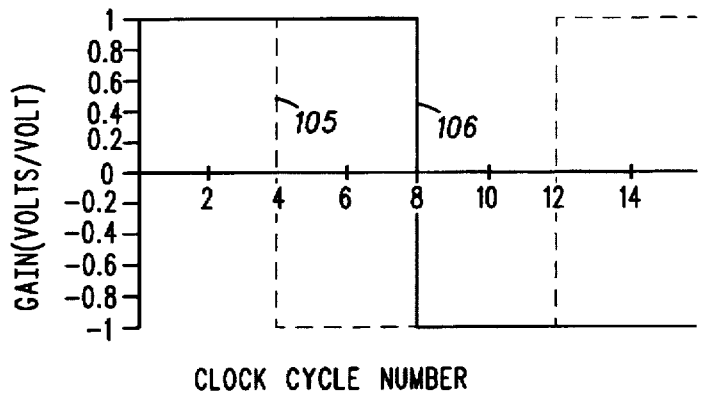
FIG.2 — PRIOR ART —
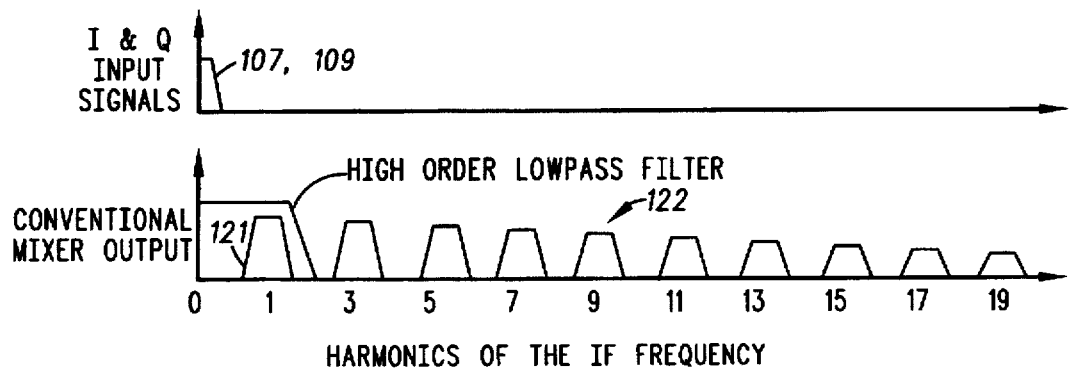
FIG.3 — PRIOR ART —

APPARATUS AND METHOD FOR FREQUENCY TRANSLATION IN A COMMUNICATION DEVICE

This application is a continuation-in-part of U.S. application Ser. No. 08/080,247, filed Jun. 21, 1993 now abandoned.

FIELD OF THE INVENTION

The present invention relates generally to communication devices and more specifically to frequency translation in communication devices.

BACKGROUND OF THE INVENTION

In a Direct Conversion Receiver it is often necessary to upconvert the baseband signal to an IF frequency for demodulation. One of the most popular types of mixers that is used in the frequency range of 0–5 MHz is a switching mixer which uses CMOS transmission gates to alternately change the gain applied to the baseband signal between the values of +1 and −1. The gain is switched at a frequency of a local oscillator, $F_{lo}$.

Switching mixers have advantages such as simplicity, low offset voltage, large dynamic range, and easy to generate quadrature switching signals using D flip-flops. However, switching mixers have one major disadvantage in that the baseband signal will be replicated at each odd harmonic of the clock signal, due to the fact that the multiplying signal is a square wave. Since the harmonic rolloff rate of a square wave is 1/n, where n is the harmonic of $F_{lo}$, an undesired signal centered at $3F_{lo}$ will be present with a level that is approximately only 9.5 dB down from the desired signal centered at $F_{lo}$. As the bandwidth of the baseband signal approaches $F_{lo}$, a bandpass filter with very steep skirt selectivity is required in order to remove the undesired harmonic signals at $3F_{lo}$ and higher.

One example of a prior art switching mixer 100 is shown in FIG. 1, in which a pair of baseband quadrature signals, I (inphase) 107 and Q (quadrature phase) 109 are received as the output of a direct conversion or "zero IF" receiver 101. These two signals bear the same information (or modulation), however, the "Q" signal 109 is phase shifted by 90 degrees from the "I" signal 107. For this example the I and Q signals 107, 109 are considered to be "lowpass signals" and the input carrier frequency is zero Hertz. The switching mixer 100 includes two opamp inverters 113, 112, and four switches 114–117 for converting the baseband signals 107, 109 to a new carrier frequency by alternately changing the gain applied to the baseband signals between +1 and −1 at a rate equal to the new carrier frequency. The outputs are summed in opamp 119 and filtered in a high Q lowpass filter 120, the output being the mixed IF signal. The switches 114–117 are controlled by controller 104, which is typically a counter receiving $F_{clock}$ input 103; illustrative control signals 105, 106 are shown in FIG. 2.

This type of mixer is popular since it is simple to build, usually only requiring 3 opamps, 4 switches and a counter. This type of mixer also has good offset voltage performance, which is usually only limited by the opamps used to build it. However, a major drawback of this type of switching mixer is the spurious output signals that appear at odd multiples of the output carrier frequency (i.e., the 3rd, 5th, 7th, . . . ). These spurious outputs usually require the use of a lowpass or bandpass filter (e.g., filter 120 of FIG. 1) as part of or following the mixer with very steep roll off. An illustrative plot of the general shape of the baseband signals 107, 109 and the output of switching mixer 100 is shown in FIG. 3. As can be seen, the spurious mixer outputs 122 shown in FIG. 3 decrease at the rate of 1/n where n is the harmonic of the clock frequency. A high order lowpass or bandpass filter (e.g., filter 120) is usually required in order to select the 1st harmonic and reject the 3rd and higher order harmonic signals.

It should also be noted that since the baseband signal is multiplied by the Fourier transform of the multiplying waveform, a solution to reduce the odd harmonics which appear at the output of the mixer is to use a sinewave as the multiplying signal. There are several circuit approaches which exploit the nonlinearity of transistors to accomplish this technique. However, they do not have the advantages of the switching mixer which were mentioned above. Thus, a need exists for a mixer having the advantages of the switching mixer described above without the having the disadvantage of the odd harmonics at its output.

BRIEF DESCRIPTION OF THE DRAWINGS

FIG. 1 generally depicts in block diagram form a prior art switching mixer.

FIG. 2 illustrates the control signals used in connection with the switching mixer of FIG. 1;

FIG. 3 illustrates the input and output signals, including harmonics, of the switching mixer of FIG. 1;

DETAILED DESCRIPTION OF THE PREFERRED EMBODIMENTS

Figure 5:
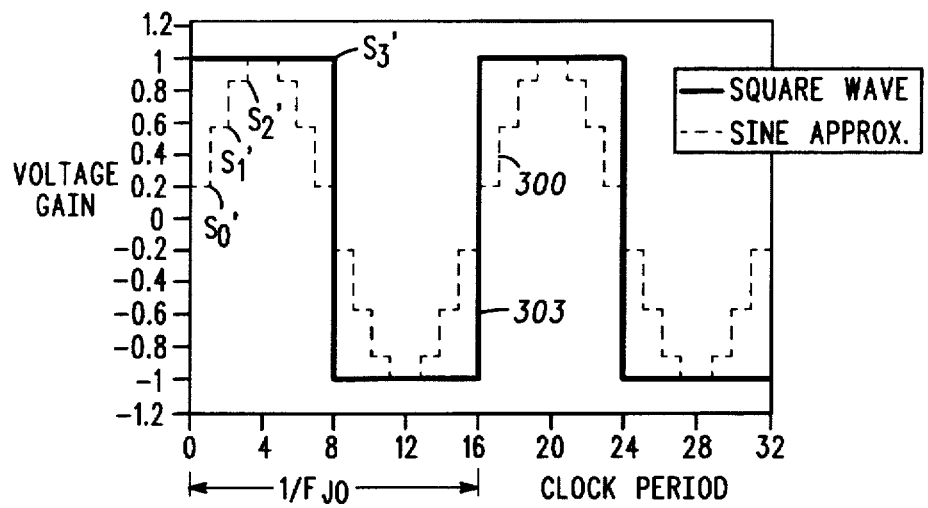
FIG. 5 generally depicts a square wave and a sinewave approximation in accordance with the first embodiment of the invention.

The proposed invention uses a multiplying digital-to-analog (D/A) converter and a counter to generate a stair case type multiplying signal which approximates a sinewave with frequency equal to $F_{lo}$. In effect, the baseband signal is multiplied by several values other than just +1 and −1 as in the simple switching mixer. The D/A converter is clocked at a frequency that is equal to $NF_{lo}$ and the D/A converter has N/2 steps (N/4 positive steps and N/4 negative steps). FIG. 5 shows a square wave 303 and a sinewave approximation 300 generated by the proposed invention with N=16.

If the step sizes of the multiplying D/A converter are chosen properly, sinewave approximation 300 is good enough that several of the undesired harmonic signals may be set to zero (namely those that are closest to the desired signal). In most cases the mixer in accordance with the invention will eliminate the need for a high selectivity bandpass filter and will require only a simple lowpass filter to provide adequate attenuation to the harmonic signals which are not zero.

It can be shown that if the step sizes are chosen properly, the only harmonics of $F_{lo}$ which appear at the output of the invention must satisfy the following equation.

$$n = iN \pm 1 \text{ where } i=0,1,2,3\ldots$$

For the example that is shown (N=16), the first non zero undesired harmonic would be centered at $15F_{lo}$ compared to $3F_{lo}$ for the conventional switching mixer. There will be no undesired signals centered at $3F_{lo}$, $5F_{lo}$, $7F_{lo}$, $9F_{lo}$, $11F_{lo}$ and $13F_{lo}$ at the output of the mixer in accordance with the invention. This performance would not be achievable using any finite amount of selectivity following a switching mixer. The mixer in accordance with the invention gives infinite rejection to all harmonics between 2 and 14 (2 and N-2 for the general case) and will usually require only a simple lowpass filter to remove the 15th and higher harmonics. The mixer in accordance with the invention has all of the benefits of switching mixers mentioned above, as well as the added benefit of having reduced harmonic content.

Figure 4:
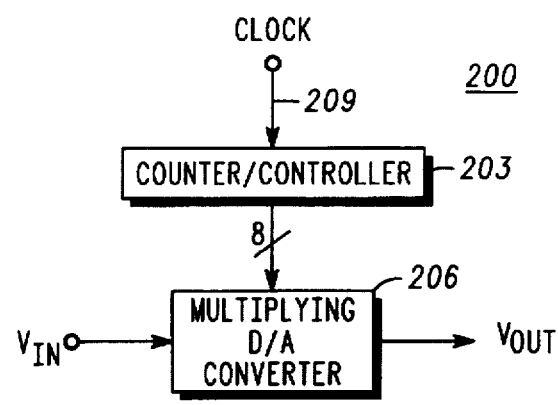
FIG. 4 generally depicts in block diagram form a first embodiment switching mixer in accordance with the invention.

FIG. 4 shows a block diagram of a switching mixer 200 in accordance with a first embodiment of the invention. The gain applied to the baseband signal Vin is controlled by counter/controller 203 and a multiplying D/A converter 206. The gain of multiplying D/A converter 206 as a function of time is shown in FIG. 5 by the dotted sinewave approximation 300. Counter/controller 203 includes an up/down counter which automatically changes count direction when it has reached either its maximum or minimum value. For the example shown (N=16), the clock signal 209 has a frequency 16 times the desired frequency of sinewave approximation 300. Sinewave approximation 300 is approximated by 16 steps and due to its symmetry, 4 positive steps and 4 negative steps are required. The absolute value of the positive steps and the negative steps are equal. The symmetry of sinewave approximation 300 restricts the frequency of clock signal 209 to only integer multiples of 4 times the frequency of sinewave 300.

Since we have assumed that the frequency of clock signal 209 must be related to the frequency of sinewave approximation 300 by an integer multiple of 4 and that the same step sizes must be used in each quadrant of the square wave, the symmetry of the sinewave approximation 300 may be exploited in order to simplify the calculation of the Fourier Transform. Furthermore, sinewave approximation 300 has odd symmetry, we need only keep the sine terms in the calculation of the Fourier Transform. If we denote the sinewave frequency as $\omega_o$, then the Fourier Transform of the multiplying waveform will be given by:

$$f(t) = \sum_{n=0}^{n=\infty} A_n \sin(n\omega_o t)$$

where $$A_n = \frac{2}{\pi} \int_0^\pi f(t)\sin(n\theta)d\theta$$

In the example that is shown in FIG. 5, there are four steps that are used to approximate the curvature of the sinewave. The step values are $S_0, S_1, S_2$ and $S_3$. In order to simplify the Fourier Transform calculation it is convenient to define a new set of variables. These variables are:

$K_0 = S_0$
$K_1 = (S_1 - S_0)$
$K_2 = (S_2 - S_1)$
$K_3 = (S_3 - S_2)$

The $A_n$ coefficients may now be found in terms of the $K_n$ coefficients as:

$$A_n = \frac{4}{n\pi} \sin\left(\frac{n\pi}{2}\right) \left[ K_0 \sin\left(\frac{4n\pi}{8}\right) + K_1 \sin\left(\frac{3n\pi}{8}\right) + K_2 \sin\left(\frac{2n\pi}{8}\right) + K_3 \sin\left(\frac{n\pi}{8}\right) \right]$$

For the general case when N is not equal to 16 the $A_n$ coefficients are:

$$A_n = \frac{4}{n\pi} \sin\left(\frac{n\pi}{2}\right) \left[ \sum_{i=0}^{i=\frac{N}{4}-1} K\left(\frac{N}{4}-1-i\right) \sin\left(\frac{2n\pi i}{N}\right) \right]$$

Three important observations may be made from an examination of the above equation.

$A_n = 0$ for even $n$ $A_{N+n} = A_n$ (except for the factor of $\frac{1}{n}$)

$A_{N-n} = -A_n$ (except for the factor of $\frac{1}{n}$)

Due to the repetitive nature of the $A_n$ coefficients and the fact that $A_{N-n} = -A_n$ (except for the factor of 1/n), we will consider only the first N/2 coefficients. Furthermore, since the even numbered coefficients are equal to zero, it is only necessary to consider the first N/4 odd coefficients. For the example given (N=16), the first N/4 odd coefficients are $A_1$, $A_3$, $A_5$ and $A_7$. The $A_1$ term gives us our desired mixing product, while the other terms give undesired harmonic signals which we will attempt to remove. Since there are 4 unknowns (the 4 step sizes), 4 of the $A_n$ coefficients may be chosen arbitrarily. The first N/4 odd $A_n$ coefficients are chosen as follows:

$A_1 = 1.0$
$A_3 = 0.0$
$A_5 = 0.0$
$A_7 = 0.0$

Due to the repetitive nature of the An coefficients the next N/4 odd An coefficients are given by:

$A_9 = 0.0$
$A_{11} = 0.0$
$A_{13} = 0.0$ $$A_{15} = \frac{-A_1}{n} = \frac{-1}{15}$$

Since there are N/4 unknowns (the $K_n$ coefficients) and N/4 knowns (the $A_n$ coefficients) a set of N/4 equations may be written which relate the $K_n$ coefficients to the $A_n$ coefficients. These equations may be solved using any number of techniques. For the example given (N=16) the results are:

$K_0 = 0.1963495408 \quad S_0 = 0.1963495408$ $K_1 = 0.3628066440 \quad S_1 = 0.5591561849$ $K_2 = 0.2776801836 \quad S_2 = 0.8368363685$ $K_3 = 0.1502794325 \quad S_3 = 0.9871158010$ With this mixer design, the only non zero harmonics of the multiplying waveform which will appear at the mixer output, will be values of n which satisfy the following equation.

$$n = iN \pm 1 \text{ where } i=0,1,2,3 \ldots$$

The non zero An coefficients are related to $A_1$ in the same manner as the simple square wave.

$$|A_n| = \frac{|A_1|}{n}$$

In order to simplify the circuit design it is desirable to scale the step sizes so that the value of the maximum step size is equal to 1.0. The only effect that this simplification will have is a slight change in the gain of the mixer. For the example given (N=16) the new coefficients are:

$S_0 = 0.19891237$
$S_1 = 0.56645450$
$S_2 = 0.84775907$
$S_3 = 1.00000000$

These coefficients are shown in FIG. 5. The table shown below gives the first 31 harmonic levels for the conventional switching mixer and the new mixer (N=16). The harmonic levels are given in dB relative to the desired harmonic (n=1). The even order harmonics are not shown since they are zero (−∞dB) for both mixers.

TABLE 1

| n | Conventional Mixer | New Mixer |
|---|---|---|
| 1 | 0.00 | 0.00 |
| 3 | −9.54 | −∞ |
| 5 | −13.98 | −∞ |
| 7 | −16.90 | −∞ |
| 9 | −19.08 | −∞ |
| 11 | −20.83 | −∞ |
| 13 | −22.28 | −∞ |
| 15 | −23.52 | −23.52 |
| 17 | −24.61 | −24.61 |
| 19 | −25.56 | −∞ |
| 21 | −26.44 | −∞ |
| 23 | −27.23 | −∞ |
| 25 | −27.96 | −∞ |
| 27 | −28.63 | −∞ |
| 29 | −29.25 | −∞ |
| 31 | −29.83 | −29.83 |

Figure 6:
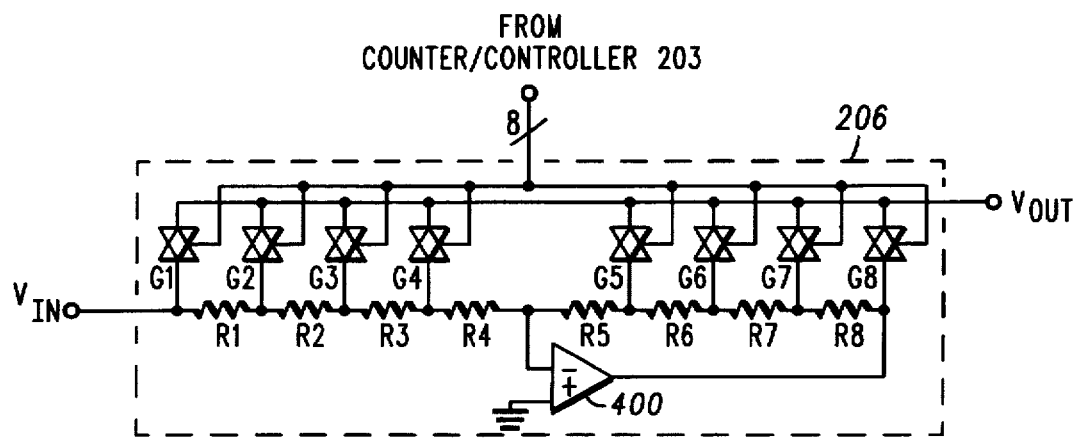
FIG. 6 generally depicts an embodiment of a multiplying D/A converter in accordance with the first embodiment of the invention.

FIG. 6 generally depicts the predetermined circuitry of the preferred embodiment of multiplying D/A converter 206 in accordance with the first embodiment of the invention. As shown in FIG. 6 a plurality of resistors designated by resistors R1–R8 are connected to an amplifier 400. Switching gates G1–G8 are utilized to switch resistors R1–R8 into and out of the predetermined circuitry via a control word output by counter/controller 203. In the preferred embodiment, the control word is a 3-bit control word. Also in the preferred embodiment, resistors R1 and R8=15.22K Ω, R2 and R7=28.13KΩ, R3 and R6=36.76KΩ and R4 and R5 =19.89KΩ which, when programmed, yield coefficients $S_0'-S_3'$ calculated above.

Operation of predetermined circuitry 206 which comprises multiplying D/A converter 206 is as follows. Clock signal 209 having a predetermined clock cycle rate (16$F_{lo}$ in the preferred embodiment) is input into counter/controller 203. For every clock cycle, counter/controller 203 outputs a predetermined control word based on the coefficients $S_0'-S_3'$ as calculated above. For a given control word, gates G1–G8 switch into and out of certain resistors R1–R8 based on the control word. This yields a certain multiplication ratio for circuitry 206 which changes every clock cycle as the control word changes. Consequently, the result of circuitry 206 changing every clock cycle is that an input signal Vin is multiplied by step sizes (based on the coefficients $S_0'-S_3'$ as calculated above) which, as a function of time, approximate sinewave approximation 300. In this manner, the advantages of a switching mixer are obtained without the exhibition of odd harmonics at the output of the mixer.

Figure 7:
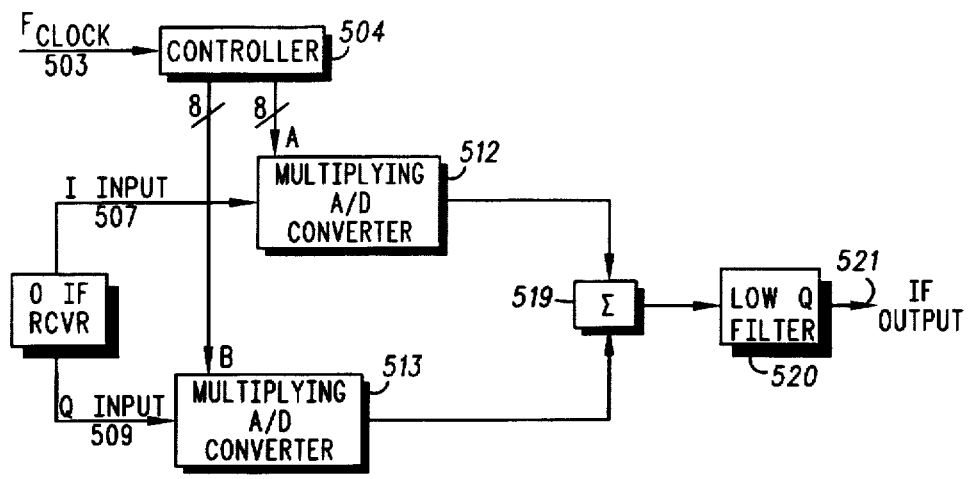
FIG. 7 generally depicts in block diagram form a second embodiment of a switching mixer in accordance with the invention.
Figure 8:
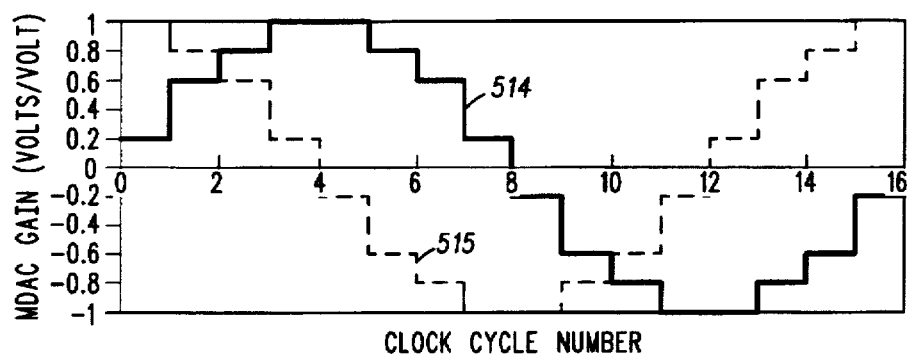
FIG. 8 illustrates the control signals that may be used in connection with the switching mixer of FIG. 7.

Turning now to FIG. 7, a second embodiment of a switching mixer in accordance with the invention is shown. Mixer 500 similarly receives I and Q inputs 507, 509 from the zero IF receiver 501. However, instead of using the opamp/switch combinations of the prior art mixer 100, two MDACs (multiplying digital to analog converters) 512, 513 are used. These MDACs 512, 513 are preferably the same as MDAC 206 shown in FIG. 6. Controller 504 again receives $F_{clock}$ signal 503, and outputs predetermined control signals based on the clock cycles. Preferably the control signals are fed over separate buses to the different MDACs, each bus having a sufficient number of lines to control the MDAC switches (G1–G8 of FIG. 6). In the illustrated case each bus has 8 lines, allowing for 8 step levels by each MDAC, or 16 steps per sinusoidal cycle. Where two MDACs are used, such as in the preferred embodiment, the controller 504 sends appropriate signals along the bus lines so as to offset the phase of the sinusoidal stepped-waveforms formed by the control signals in the different MDACs. For example, stepped waveform 514 would be the gain response of MDAC 512 (an approximate sine waveform), while stepped waveform 515 would be the gain response of MDAC 513 (an approximate cosine waveform). Where a control signal is sent once per clock cycle (alternately it could be sent at some multiple of the clock frequency), then each sinusoidal cycle represents 16 clock cycles, where 8 step levels are provided. A skilled artisan will recognize that any number of variations in the predetermined number of steps and cycle periods can be readily implemented where desired, and more than 2 MDACs may be employed, depending on the output desired. In the present embodiment two MDACs 512, 513 are employed with one having a sinewave gain and the other a cosinewave gain, since this permits mixing of the I and Q inputs 507, 509 after conversion to form one output signal after summation (or differencing if desired) in opamp 519. In other words, where the $F_{clock}$ has frequency $w_c$, and the controller outputs a control signal each clock cycle to MDACs with 8 step levels (i.e., the number N of clock cycles per sinusoidal waveform cycle=16), then the gains for MDACs 512, 513 are set such that one MDAC has a gain vs. time of approximately $\sin(w_c^*t/N)$ (waveform 514 in FIG. 8), while the other MDAC has a gain of approximately $\cos(w_c^*t/N)$ (waveform 515). This permits the input signals 507, 509 (which are at frequencies independent of the clock frequency) to be translated to an output frequency which is the sum or difference (via opamp 519) of the input frequency and the clock frequency divided by N. Because the gains of the MDACs 512, 513 are chosen to correspond to equally spaced samples of a sinusoidal waveform as a function of time, then the first non-zero spurious harmonic is (N−1) times the IF output carrier frequency 121. The 3rd, 5th, 7th ... (N−3) harmonics are canceled, and thus a dramatically reduced amount of filtering is required at the output of the mixer, allowing a low Q filter 520 to be employed.

Figure 9:
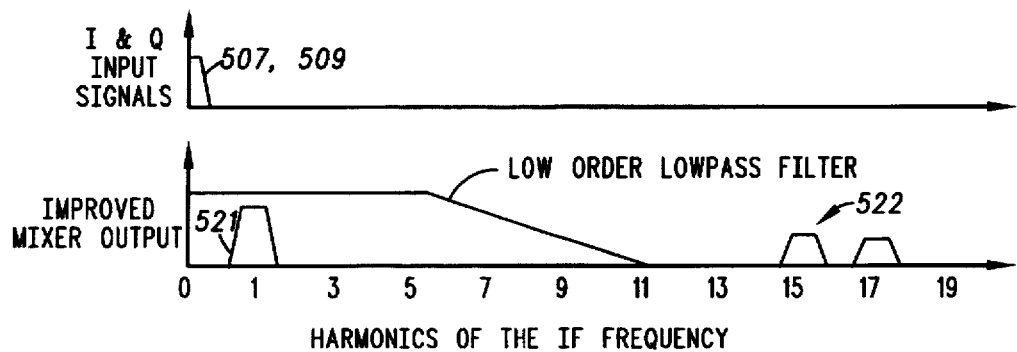
FIG. 9 illustrates the input and output signals, including harmonics, of the switching mixer of FIG. 7.

The output frequency spectrum of the proposed invention is shown in FIG. 9 for the case where N=16, so only the 15th and 17th harmonics 522 are present in the output of opamp 519. As can be seen, this is a significant improvement, permitting one to use a low Q filter for removing the harmonics from the mixing, since only higher-order harmonics remain.

Although the invention has been described and illustrated with a certain degree of particularity, it should be understood that the present disclosure of embodiments has been made by way of example only and that numerous changes in the arrangement and combination of parts as well as steps may be resorted to by those skilled in the art without departing from the invention as claimed. For example, the numbers of inputs, MDACs, steps, and cycles of the preferred embodiment as described were directed to a signal demodulating into I and Q branches (e.g., QPSK or the like for TDMA or CDMA) for signals transmitted over a radio communication channel. However, as will be understood by those skilled in the art, the techniques described and claimed herein can also be adapted for use in other types of systems, including any having the signal at zero IF or baseband prior to mixing. In addition the communication channel could alternatively be an electronic data bus, wireline, optical fiber link, satellite link, or any other type of communication channel. Thus, it will be apparent to one skilled in the art that while the invention has been described in conjunction with specific embodiments thereof, it is evident that many alterations, modifications, and variations are possible in light of the foregoing description. Accordingly, the invention is intended to embrace all such alterations, modifications, and variations within the spirit and scope of the appended claims.

What we claim is:

1. An apparatus for converting a baseband modulated in phase (I) component, and a baseband modulated quadrature (Q) component to an intermediate frequency (IF) signal, the apparatus comprising:
   a controller, having an input for receiving a clock signal with a predetermined clock cycle rate, operable for outputting a first and a second predetermined control signal based on a predetermined number of clock cycles;
   a first multiplying digital to analog conversion (MDAC) unit receiving the first predetermined control signal and the baseband modulated I component, being operable for stepping the baseband modulated I component by a stepped sinewave having predetermined step sizes to output a sinewave modulated I signal based on the first predetermined control signal;
   a second MDAC unit receiving the second predetermined control signal and the baseband modulated Q component, being operable for stepping the baseband modulated Q component by a stepped cosinewave having predetermined step sizes to output a cosinewave modulated Q signal based on the second predetermined control signal; and
   a summing unit receiving the first and the second MDAC output signals and being operable for summing the output signals to form the IF signal.

2. The apparatus of claim 1 wherein the first MDAC receiving the I component and first predetermined control signal and being operable in response to the first control signal to multiply the I component by a stepped sinewave having predetermined step sizes to form a sinewave modulated I signal, and the second MDAC receiving the Q component and second predetermined control signal and being operable in response to the second control signal to multiply the Q component by a stepped cosinewave having the same predetermined step sizes to form a cosinewave modulated Q signal, both stepped sinewave and cosinewave having a same predetermined number of steps per cycle.

3. The apparatus of claim 2, wherein the summing unit is an opamp operable for summing the sinewave modulated I signal and cosinewave modulated Q signal to form the IF signal having a carrier frequency approximately equal to the clock cycle rate divided by the predetermined number of steps per cycle.

4. The apparatus of claim 3, wherein the first and second control signals comprise a first and second set of control words, respectively, each control word corresponding to a one of the predetermined number of steps.

5. The apparatus of claim 4, wherein each MDAC comprises a plurality of resistors each having predetermined values and switches associated with the resistors, and the predetermined step sizes are non-linear and optimally predetermined by which ones of the plurality of resistors are switched on so as to receive a one of the I and Q signal.

6. The apparatus of claim 4 where the step sizes are linear step sizes.

7. The apparatus of claim 1, wherein the apparatus comprises a receiver having a switching mixer, the switching mixer including the controller, the first and second MDAC units, and the summing unit.

8. A method for converting a baseband modulated in phase (I) component, and a baseband modulated quadrature (Q) component to an intermediate frequency (IF) signal, the method comprising the steps of:
   receiving, by a controller, a clock signal with a predetermined clock cycle rate and outputting a first and a second predetermined control signal based on a predetermined number of clock cycles;
   receiving, by a first multiplying digital to analog conversion (MDAC) unit, the first predetermined control signal and the baseband modulated I component, and stepping the I component by a stepped sinewave based on the first control signal to output a first MDAC output signal approximating a sinusoid having a first phase;
   receiving, by a second MDAC unit, the second predetermined control signal and the baseband modulated Q component, and stepping the Q component by a stepped cosinewave based on the second control signal to output a second MDAC output signal approximating the sinusoid having a second phase; and
   receiving the first and the second MDAC output signals in a summing unit and summing the first and the second MDAC output signals to form the IF signal.

9. The method of claim 8, wherein the first MDAC receiving the I components and first particular control signal and multiplying the I component, in response to the first control signal, by a stepped sinewave having predetermined step sizes to form a sinewave modulated I signal, and the second MDAC receiving the Q component and second control signal and multiplying the Q component, in response to the second control signal, by a stepped cosinewave having the same predetermined step sizes to form a cosinewave modulated Q signal, both stepped sinewave and cosinewave having a same predetermined number of steps per cycle.

10. The method of claim 9, wherein the step of summing comprise summing the sinewave modulated I signal and cosinewave modulated Q signal to form the frequency translated output signal having a carrier frequency approximately equal to the clock cycle rate divided by the predetermined number of steps per cycle.

11. The method of claim 10, wherein the first and second sets of control signals comprise a first and second set of control words, respectively, each control word corresponding to a one of the predetermined number of steps.

12. The method of claim 11, wherein each MDAC comprises a plurality of resistors each having predetermined values and switches associated with the resistors, and the predetermined step sizes are non-linear and optimally predetermined by which ones of the plurality of resistors are switched on so as to receive a one of the I and Q signal.

13. The method of claim 11 where the step sizes are linear step sizes.

14. A method of frequency translation comprising:

receiving, by a controller, a clock signal with a predetermined clock cycle rate and outputting predetermined control signals based on a predetermined number of clock cycles;

receiving, by a multiplying digital to analog conversion (MDAC) unit, plural input signals having a same modulation and the control signals, and stepping the input signals based on the control signals to output plural MDAC output signals each approximating a sinusoid of same amplitude and period but differing in phase; and receiving the MDAC output signals in a summing unit and summing the MDAC output signals to form a frequency translated output signal.

* * * * *